(12) United States Patent
Welch

(10) Patent No.: US 6,268,777 B1
(45) Date of Patent: Jul. 31, 2001

(54) SINGLE INDUCTOR FULLY INTEGRATED DIFFERENTIAL VOLTAGE CONTROLLED OSCILLATOR WITH AUTOMATIC AMPLITUDE ADJUSTMENT AND ON-CHIP VARACTOR

(75) Inventor: James R. Welch, Maplegrove, MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/196,830

(22) Filed: Nov. 20, 1998

Related U.S. Application Data

(63) Continuation of application No. 60/066,220, filed on Nov. 20, 1997.

(51) Int. Cl.[7] .............................. H03B 5/00; H03L 5/00
(52) U.S. Cl. ............................... 331/117 FE; 331/109; 331/183
(58) Field of Search .................. 331/117 FE, 117 R, 331/182, 183, 167, 74, 177 V, 109

(56) References Cited

U.S. PATENT DOCUMENTS

| | | | |
|---|---|---|---|
| 3,904,988 | * | 9/1975 | Hsiao ................................. 331/111 |
| 4,588,968 | * | 5/1986 | Wile ................................... 331/109 |
| 4,658,220 | | 4/1987 | Heston et al. ....................... 330/277 |
| 4,853,649 | | 8/1989 | Seino et al. ......................... 330/277 |
| 5,111,157 | | 5/1992 | Komiak .............................. 330/286 |
| 5,130,674 | * | 7/1992 | Pham et al. ......................... 331/109 |
| 5,574,405 | | 11/1996 | Razavi ................................. 331/2 |
| 5,600,283 | * | 2/1997 | Sauer .................................. 331/111 |
| 5,663,690 | | 9/1997 | McGinn .............................. 331/109 |
| 5,757,230 | | 5/1998 | Mangelsdorf ....................... 330/133 |
| 5,764,109 | | 6/1998 | Kukkonen ............................ 331/44 |
| 5,818,880 | | 10/1998 | Kriz et al. ........................... 375/306 |
| 5,914,513 | * | 6/1999 | Shenai et al. ....................... 257/312 |
| 6,052,036 | * | 4/2000 | Enström et al. ..................... 331/176 |

OTHER PUBLICATIONS

S Burns, P Bond " Principles of Electroninc circuits" 1987 pp. 710 and 711.*

* cited by examiner

Primary Examiner—Robert Pascal
Assistant Examiner—Kimberly E Glenn
(74) Attorney, Agent, or Firm—Gary Cary

(57) ABSTRACT

The voltage controlled oscillator (VCO) of the present invention generally includes a energy storage circuit portion, an oscillator operably connected to the energy storage circuit portion, a varactor connected to the oscillator and energy storage circuit portion, and an amplitude controller that is operably connected to the energy storage circuit portion, oscillator, and varactor. The energy storage circuit portion includes an inductance and a capacitance. The oscillator provides an oscillating output signal having a frequency and an amplitude. The varactor has a capacitance and receives an input signal having a varying level. The capacitance of the varactor varies according to the level of the input signal. The amplitude controller sets the amplitude of the oscillating output signal. Meanwhile, the inductance of the energy storage circuit portion, the capacitance of the energy storage circuit portion, and the varying capacitance of the varactor are used to set the frequency of the oscillating output signal. The VCO of the present invention is preferably fabricated entirely on a single integrated circuit chip utilizing low-cost CMOS technology.

35 Claims, 2 Drawing Sheets

SINGLE INDUCTOR FULLY INTEGRATED DIFFERENTIAL VOLTAGE CONTROLLED OSCILLATOR WITH AUTOMATIC AMPLITUDE ADJUSTMENT AND ON-CHIP VARACTOR

CROSS-REFERENCE TO RELATED APPLICATIONS

This application claims priority under 35 USC § 119 to U.S. patent application Ser. No. 60/066,220, filed Nov. 20, 1997, which is hereby incorporated by reference.

BACKGROUND OF THE INVENTION

1. Field of the Invention

The invention relates to radio frequency communication and more particularly, to voltage controlled oscillators (VCOs) used in radio frequency signal transmission systems.

2. Description of Related Art

Voltage controlled oscillators (VCOs) are a common component in most communications circuits. VCOs typically utilize a variable control voltage input to produce a frequency output. The control voltage input typically may be tuned so that the VCO produces a desired, operational frequency output. Examples of VCOs and the manners in which they are tuned may be found in U.S. Pat. Nos. 5,663,690 and 5,764,109. As these patents show, a typical inductor and capacitor tuned VCO generally requires a number of off-chip components including inductors, capacitors, resistors and varactors. Using off-chip components rather than an integrated circuit (IC) requires more space, increases the power requirements, and adds significantly to the cost of a radio frequency communication system. One problem with known VCOs is that there are few, if any, integrated circuit VCOs that can provide a desired differential output, which is necessary for high performance transceivers, and that can maintain a fixed frequency over all process and environmental variations. Further, there are few, if any, integrated circuit VCOs that can adjust the amplitude of the VCO to optimize power consumption and optimize spectral purity, features that are key to battery operated wireless communication devices.

As such, there is a need for a VCO that can be fabricated with CMOS technology to reduce the cost and space required for typical VCOs. Further, there is a need for an integrated circuit VCO that can provide a differential output, maintain a fixed frequency, and adjust the amplitude for optimum power and optimum spectral purity.

SUMMARY OF THE INVENTION

The needs described above are in large measure met by a voltage controlled oscillator (VCO) of the present invention. The VCO generally includes an energy storage circuit portion, an oscillator operably connected to the energy storage circuit portion, a varactor connected to the oscillator and energy storage circuit portion, and an amplitude controller that is operably connected to the energy storage circuit portion, oscillator, and varactor. The energy storage circuit portion includes an inductance and a capacitance. The oscillator provides an oscillating output signal having a frequency and an amplitude. The varactor has a varying capacitance and receives an input signal having a varying level. The capacitance of the varactor varies according to the level of the input signal. The amplitude controller sets the amplitude of the oscillating output signal. Meanwhile, the inductance of the energy storage portion, the capacitance of the energy storage portion, and the varying capacitance of the varactor are used to set the frequency of the oscillating output signal. The VCO of the present invention is preferably fabricated entirely on a single integrated circuit chip utilizing low-cost CMOS technology.

The present invention further comprises a method of adjusting the frequency and amplitude of an oscillating output signal. The steps of the method include: (1) receiving a varying input signal having a varying level; (2) varying a capacitance of a varactor according to the varying level of the input signal; (3) adjusting the operating frequency of an oscillator according to the capacitance of the varactor; (4) providing current conduction for amplitude control upon an energy storage portion reaching or exceeding a peak level; (5) continuing to provide current conduction to stabilize the amplitude of the oscillating output signal; and (6) adjusting the current to achieve a desired amplitude after the amplitude of the oscillating output signal has stabilized.

DETAILED DESCRIPTION OF THE PREFERRED EMBODIMENTS

A voltage controlled oscillator (VCO) 20 for use in radio frequency communication systems is described herein.

Figure 1A:
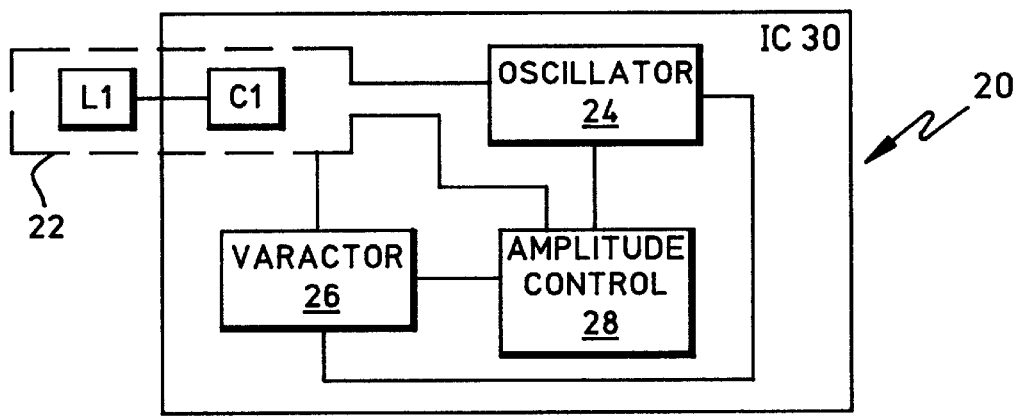
FIG. 1A is a schematic drawing of an integrated circuit (IC) containing a voltage controlled oscillator according to the present invention.
Figure 1B:
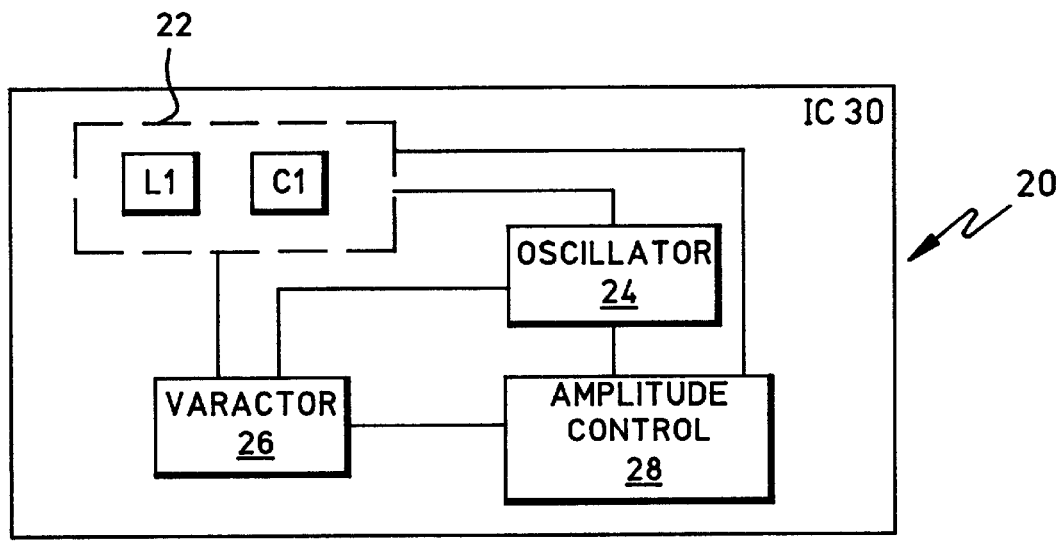
FIG. 1B is an alternative embodiment of the present invention of FIG. 1A, with an inductor being on-chip.

Referring to FIGS. 1A and 1B, VCO 20 generally includes an energy storage circuit portion 22 including an inductor L1 and a capacitor C1, an oscillator circuit portion 24, a varactor circuit portion 26 and an amplitude control circuit portion 28. In the preferred embodiment of the present invention, energy storage circuit portion 22 is a tank circuit. VCO 20 is preferably fabricated on a single integrated circuit (IC) chip 30 by utilizing a low-cost CMOS fabrication process. FIG. 1A depicts an embodiment of VCO 20 wherein inductor L1 of LC tank circuit 22 is located off-chip from the remaining portions of VCO 20. This configuration is more cost effective for frequencies around 500 MHz or less. FIG. 1B depicts an embodiment of VCO 20 wherein inductor L1 is located on-chip. This configuration is more cost effective for frequencies greater than 500 MHz.

Figure 2:
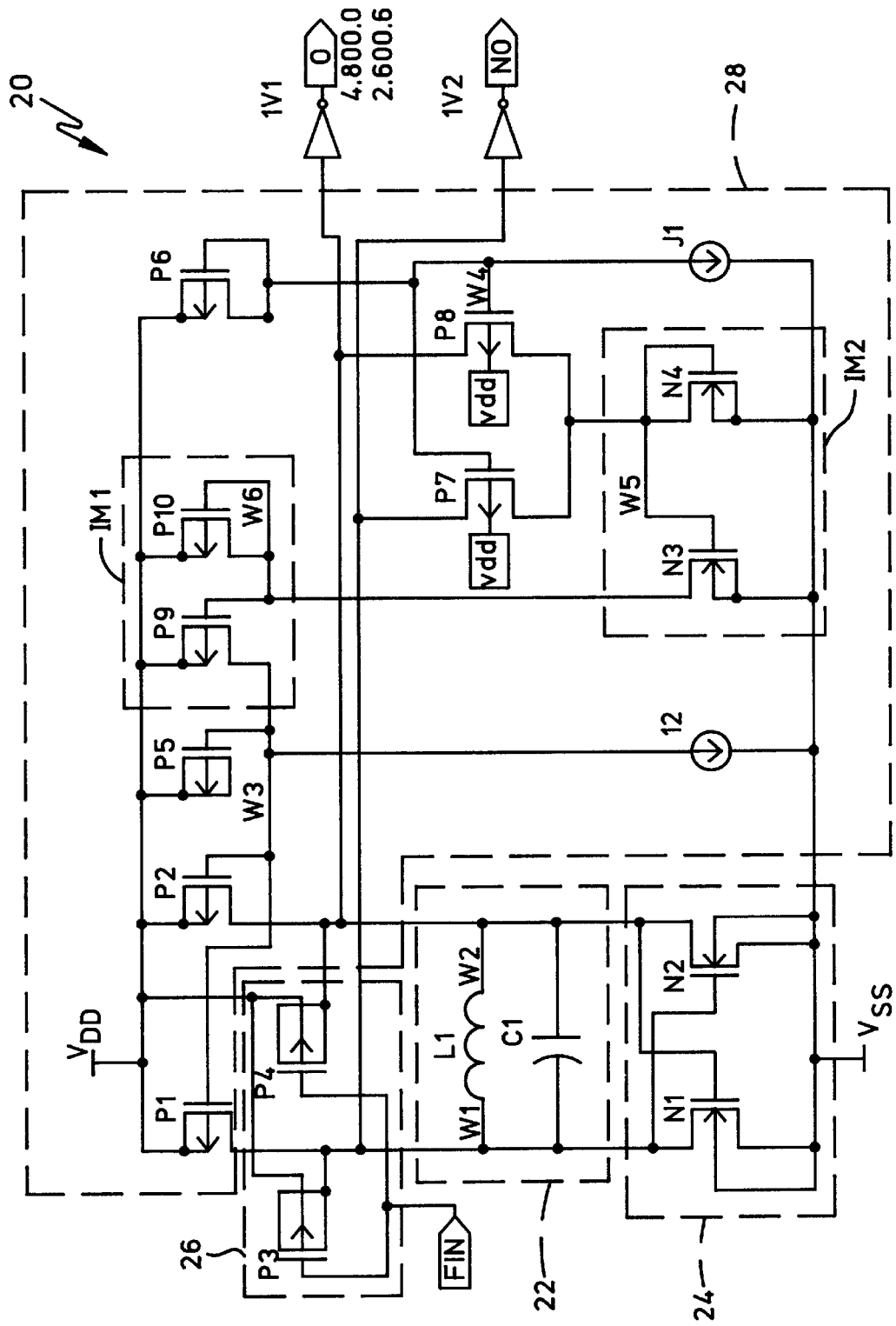
FIG. 2 is a circuit diagram of the VCO according to the present invention.

Referring to FIG. 2, a detailed schematic of VCO 20 is provided. As stated above, LC tank 22 is formed by inductor L1 and capacitor C1. Oscillator 24 is generally formed by n-channel, depletion-mode MOSFETs N1 and N2. Varactor 26 is generally formed by p-channel, depletion-mode MOSFETs P3 and P4. The remaining portions of VCO 20, including p-channel MOSFETs P1, P2, P5, P6, P7, P8, P9, and P10, n-channel, depletion-mode MOSFETs N3 and N4, and current sources I1 and I2, make up amplitude control portion 28 of VCO 20.

As shown, the input signal to VCO 20 is provided at node $F_{IN}$, which is tied to the gates of P3 and P4. The drain of P3 is tied to the source of P3 at node W1 and the drain of P4 is tied to the source of P4 at node W2. The body of P3 is connected to the body of P4 which are both connected to $V_{DD}$. MOSFETs P3 and P4 are configured to form capacitively variable devices based on the voltage received, in other words, they are varactors and are arranged to form circuit portion 26. A balanced, differential oscillating output signal is provided from nodes W1 and W2 to output nodes IV2 and IV1, respectively.

As will be described below in the description of the operation of the circuit, L1 and C1 of LC tank 22 are connected between nodes W1 and W2 as is oscillator 24. Specifically, with respect to oscillator 24, the gate of N2 is tied to W1 and the gate of N1 is tied to W2. The drain of N1 is also connected to node W1 while both the body and source of N1 are tied to $V_{SS}$ (ground). The drain of N2 is connected to node W2 while both the body and source of N2 are tied to $V_{SS}$.

Referring now to amplitude control portion 28, the drain of P1 is connected to node W1 while the body is connected to the source of P1, which in turn is connected to $V_{DD}$ (preferably, approximately 3 V). The gate of P1 is connected to node W3. With respect to P2, the body is tied to the source, which in turn is tied to $V_{DD}$, while the drain is connected to node W2 and the gate is connected to node W3. With respect to P5, the drain is tied to the source, as is the body. The source of P5 is connected to $V_{DD}$ and the gate of P5 is connected to node W3. Current source I2 is connected between node W3 and $V_{SS}$. A current mirror IM1 is formed by the combination of P9 and P10. With respect to P9, the drain is connected to node W3, the body is tied to the source, which in turn is connected to $V_{DD}$ and the gate of P9 is connected to node W6. With respect to P10, the body is tied to the source, which in turn is connected to $V_{DD}$ while both the drain and gate are connected to node W6.

With respect to P6, the body is tied to the source, which in turn is connected to $V_{DD}$ and the drain and gate are connected to node W4. P7 and P8 are configured as common gate amplifiers. With respect to P8, the source is connected to node W2, the body is connected to $V_{DD}$, the drain is connected to node W5, and the gate is connected to node W4. With respect to P7, the source is connected to node W1, the body is connected to $V_{DD}$, the drain is connected to node W5 and the gate is connected to node W4. Current source I1 is connected between node W4 and $V_{SS}$.

A current mirror IM2 is formed by the combination of N3 and N4. With respect to N3, the drain is connected to node W6, the body is connected to the source, which in turn is tied to $V_{SS}$ and the gate is connected to node W5. With respect to N4, both the gate and drain are connected to node W5 while the body is connected to the source, which in turn is connected to $V_{SS}$.

Operation of VCO:
1. Frequency Adjustment of VCO

Figure 3:
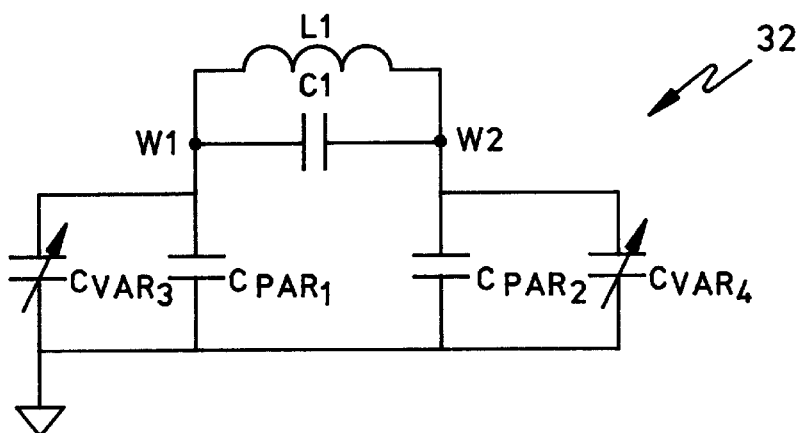
FIG. 3 is an equivalent small signal tank circuit for the VCO according to the present invention.

The frequency of VCO 20 is adjusted by altering the capacitance of LC tank 22. The capacitance of tank 22 is altered by adjustments in voltage input $F_{IN}$ to MOS varactors P3 and P4. As stated above, varactors P3 and P4 essentially form voltage variable capacitors. In the instance of a MOS varactor, the MOSFET's gate-to-source/drain capacitance varies with the gate-to-source/drain voltage. To explain further, reference is made to FIG. 3. Here, LC tank 22 is represented by an equivalent small signal tank circuit 32. The inductances and capacitances that contribute to the calculation of frequency of VCO 20 are shown. Capacitance $C_{PAR1}$ and capacitance $C_{PAR2}$ represent the total parasitic capacitance on LC tank 22 nodes W1 and W2, respectively. This parasitic capacitance is due to transistor loading and metal capacitance (e.g. bond pad, package pin, board capacitance, etc.). Capacitance $C_{VAR3}$ and capacitance $C_{VAR4}$ represent the varactor capacitance of varactors P3 and P4, respectively. The operation frequency of VCO 20 is defined as follows:

$$f_0 = \frac{1}{2\pi\sqrt{L1(C_T)}} \quad (1)$$

where:

$$C_T = C1 + \frac{C_{PAR}}{2} + \frac{C_{VAR}}{2};$$
$$C_{PAR} = C_{PAR1} + C_{PAR2}; \text{ and}$$
$$C_{VAR} = C_{VAR1} + C_{VAR2}.$$

As such, the frequency of VCO 20 is adjusted by varying $C_{VAR}$. $C_{VAR}$ varies in accordance with input signal $F_{IN}$, i.e. the input signal $F_{IN}$ controls $C_{VAR}$ by adjusting the gate-to-source/drain voltage on P3 and P4. It should be noted that the specific capacitance versus voltage curve of a MOS varactor depends upon the transistor size, e.g. gate width and length, as well as transistor processing, e.g. gate oxide thickness, transistor threshold voltage, etc.

L1 and C1 are chosen to set the center operational frequency of VCO 20. By way of a non-limiting example, if VCO 20 is desired to have a center operational frequency of 434 MHz, the following component values are appropriate:

L1=50 nH;

2.2 pF<$C_{VAR}$<4.4 pF;

C1=1 pF; and $C_{PAR}$=0.2 pF;

providing VCO 20 with a frequency range of approximately 390 MHz to approximately 480 MHz. Of course, other component values may be used without departing from the spirit or scope of the invention. In general, achievable tuning ranges are the center frequency ±10%.

2. Amplitude Adjustment of VCO

As indicated above, the differential voltage signals of LC tank 22 are at nodes W1 and W2. In the case where there is no signal present at nodes W1 and W2, e.g. at start up, common gate amplifiers P7 and P8 are biased in the "off" state, i.e. there is no drain current, and, as such, no current flows through current mirror IM2. As a result, no current flows through current mirror IM1 which means that current source I2 is free to decrease the gate voltages of P1 and P2. The decreasing of the gate voltages of P1 and P2 results in the oscillator 24 being energized and starts the oscillations from oscillator 24 growing in amplitude.

Eventually, as the signal at nodes W1 and W2 from LC tank 22 grows in amplitude, P7 and P8 begin to conduct current during the peaks of the signals. This conduction of current occurs when the peak voltages of the signals at W1 and W2 are greater than the following voltage:

$$\text{Voltage} = V_{DD} - V_{SG9} + V_{th9} \quad (2)$$

where:

$V_{DD}$ is the supply voltage $V_{SG9}$ is the source-to-drain voltage of P9

$V_{th9}$ is the PMOS threshold voltage of P9.

In this manner, P7 and P8 act as full wave rectifiers and inject a current into current mirror IM2. This injected current represents the amplitude of the signal at nodes W1 and W2 of LC tank 22. This injected current is mirrored by current mirror IM1 and fed to P1 and P2, so as to increase the gate voltage of P1 and P2. When the DC current into node W3 equals the current of current source I2, the bias voltage on P1 and P2 reaches equilibrium and the amplitude of VCO 20 is stabilized.

In summary, the bias current I2 pulls down on node W3, which operates to increase the bias current through LC tank 22. The pulling down on node W3 also increases the amplitude of oscillations of oscillator 24 until the peak amplitude of LC tank 22 at nodes W1 and W2 reaches ($V_{DD}-V_{SG9}+V_{th9}$). At that point, the current through current mirror IM2 is mirrored to P9, which limits the voltage on node W3 from dropping further, thus, providing the optimum bias voltage on P1 and P2.

The final desired amplitude can be set by adjusting either current source I1 or the transistor geometry, i.e. gate width and length, of P9. Amplitude control 28 portion of VCO 20, which may be deemed the amplitude control feedback loop, is compensated by P5 which is a PMOS transistor connected as a gate capacitor. The gate capacitance creates a dominant pole in the feedback loop frequency response with the large output resistance of P9.

3. Features of VCO

VCO 20 as described above has the feature of being implemented entirely with low cost CMOS technology which greatly reduces the cost and space required to integrate VCO 20 in a communications system. Additionally, VCO 20 may be implemented with an on-chip or off-chip inductor L1 as appropriate for cost savings according to the frequency of operation of VCO 20. For example, for operation around 500 MHz or less, the off-chip inductor, illustrated in FIG. 1A, is more cost effective while for operation greater than 500 MHz, the on-chip inductor, illustrated in FIG. 1B, is generally more cost effective.

VCO 20, as described above, also has the feature of automatic amplitude adjustment. As previously discussed, the automatic amplitude adjustment of VCO 20 minimizes/optimizes power. The desired optimum power is dependent on the application. Typically, the desired optimum power is driven by the phase noise requirements of the circuit. The phase noise requirements of VCO 20 for a modern radio application are typically in the 70 to 90 dBc/Hz at 20 KHz offset from the center frequency. As such, a typical LC tank power for VCO 20 ranges from −25 to −15 dBm. The automatic amplitude adjustment of VCO 20 also optimizes spectral purity. Spectral purity refers to the phase noise performance of the VCO; phase noise comprises the noise sidebands of a signal when viewed with a spectrum analyzer, i.e. deviations from a perfect straight line on the spectrum.

VCO 20, as described above, also has the feature of achieving a wide tuning range by utilizing a MOS varactor. Total capacitance variations of 2× (ratio on minimum and maximum capacitances) for varactor 26 can usually be achieved which, in general, provides a tuning range for VCO 20 of the center frequency ±10%.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A voltage controlled oscillator (VCO) for use in communication systems, comprising:

an energy storage circuit portion having an inductance and a capacitance;

an oscillator providing an oscillating output signal having a frequency and an amplitude, wherein said oscillator is operably connected to said energy storage circuit portion;

a varactor having a capacitance, wherein said varactor is operably connected to said energy storage circuit portion ad said oscillator, wherein said varactor receives an input signal having a varying level, and wherein said capacitance of said varactor varies according to said varying level of said input signal;

an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said varactor comprises at least one MOSFET.

2. The VCO of claim 1, wherein said inductance of said energy storage circuit portion, said capacitance of said energy storage circuit portion, and said capacitance of said varactor determine said frequency of said oscillating output signal.

3. A voltage controlled oscillator (VCO) for use in communication systems, comprising:

an energy storage circuit portion having an inductance and a capacitance;

an oscillator providing an oscillating output signal having a frequency and an amplitude, wherein said oscillator is operably connected to said energy storage circuit portion;

a varactor having a capacitance, wherein said varactor is operably connected to said energy storage circuit portion and said oscillator, wherein said varactor receives an input signal having a varying level, and wherein said capacitance of said varactor varies according to said varying level of said input signal;

an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said voltage controlled oscillator is fabricated entirely with CMOS technology.

4. The VCO of claim 3, wherein said inductance of said energy storage circuit portion, said capacitance of said energy storage circuit portion, and said capacitance of said varactor determine said frequency of said oscillating output signal.

5. A voltage controlled oscillator (VCO) for use in communication systems, comprising:

an energy storage circuit portion having an inductance and a capacitance;

an oscillator providing an oscillating output signal having a frequency and an amplitude, wherein said oscillator is operably connected to said energy storage circuit portion;

a varactor having a capacitance, wherein said varactor is operably connected to said energy storage circuit portion and said oscillator, wherein said varactor receives an input signal having a varying level, and wherein said capacitance of said varactor varies according to said varying level of said input signal;

an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said energy storage circuit portion comprises an inductor and a capacitor, and wherein said capacitor of said energy storage circuit portion, said oscillator, said varactor, and said amplitude controller are fabricated entirely on-chip with CMOS technology and wherein said inductor of said energy storage circuit portion is located off-chip.

6. The VCO of claim 5, wherein said inductance of said energy storage circuit portion, said capacitance of said energy storage circuit portion, and said capacitance of said varactor determine said frequency of said oscillating output signal.

7. A voltage controlled oscillator (VCO) for use in communication systems, comprising:

an energy storage circuit portion having an inductance and a capacitance;

a oscillator providing an oscillating output signal having a frequency and an amplitude, wherein said oscillator is operably connected to said energy storage circuit portion;

a varactor having a capacitance, wherein said varactor is operably connected to said energy storage circuit portion and said oscillator, wherein said varactor receives an input signal having a varying level, and wherein said capacitance of said varactor varies according to said varying level of said input signal;

an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said oscillator provides a balanced, differential, oscillating output signal.

8. The VCO of claim 7, wherein said inductance of said energy storage circuit portion, said capacitance of said energy storage circuit portion, and said capacitance of said varactor determine said frequency of said oscillating output signal.

9. A voltage controlled oscillator (VCO) for use in communication systems, comprising:

an energy storage circuit portion having an inductance and a capacitance;

an oscillator providing an oscillating output signal having a frequency and an amplitude, wherein said oscillator is operably connected to said energy storage circuit portion;

a varactor having a capacitance, wherein said varactor is operably connected to said energy storage circuit portion and said oscillator, wherein said varactor receives an input signal having a varying level, and wherein said capacitance of said varactor varies according to said varying level of said input signal;

an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said amplitude controller provides automatic, closed-loop adjustment of said amplitude of said oscillating output signal.

10. The VCO of claim 9, wherein said inductance of said energy storage circuit portion, said capacitance of said energy storage circuit portion, and said capacitance of said varactor determine said frequency of said oscillating output signal.

11. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives an input signal having a varying level, and wherein said variable capacitance varies according to said varying level of said input signal;

amplitude control means including a fist current mirror and a second current mirror operably connected to said energy storage means, said oscillating means and said variable capacitance means for initiating oscillation of said oscillating means and controlling said amplitude of said output signal; and wherein said variable capacitance means comprises at least one MOSFET.

12. The VCO of claim 11, wherein said inductance of said energy storage means, said capacitance of said energy storage means, and said variable capacitance of said variable capacitance means determine said frequency of said oscillating output signal.

13. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives an input signal having a varying level, and wherein said variable capacitance varies according to said varying level of said input signal;

amplitude control means including a fist current minor and a second current mirror operably connected to said energy storage means, said oscillating means and said variable capacitance means for initiating oscillation of said oscillating means and controlling said amplitude of said output signal; and wherein in said voltage controlled oscillator is fabricated entirely with CMOS technology.

14. The VCO of claim 13, wherein said inductance of said energy storage means, said capacitance of said energy storage means, and said variable capacitance of said variable capacitance means determine said frequency of said oscillating output signal.

15. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives an input signal having a varying level, and wherein said variable capacitance varies according to said varying level of said input signal;

amplitude control means including a first current mirror and a second current mirror operably connected to said energy storage means, said oscillating means and said variable capacitance means for initiating oscillation of said oscillating means and controlling said amplitude of said output signal; and wherein said energy storage means comprises an inductor and a capacitor, and wherein said capacitor of said energy storage means, said oscillating means, said variable capacitance means, and said amplitude control means are fabricated entirely on-chip with CMOS technology and wherein said inductor of said energy storage means is located off-chip.

16. The VCO of claim 15, wherein said inductance of said energy storage means, said capacitance of said energy storage means, and said variable capacitance of said variable capacitance means determine said frequency of said oscillating output signal.

17. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives all input signal having a vying level, and wherein said variable capacitance varies according to said varying level of said input signal;

amplitude control means including a first current minor and a second current mirror operably connected to said energy storage means, said oscillating means and said variable capacitance means for initiating oscillation of said oscillating means and controlling said amplitude of said output signal; and wherein said oscillating means provides a balanced, differential, oscillating output signal.

18. The VCO of claim 17, wherein said inductance of said energy storage means, said capacitance of said energy storage means, and said variable capacitance of said variable capacitance means determine said frequency of said oscillating output signal.

19. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives an input signal having a varying level, and wherein said variable capacitance varies according to said varying level of said input signal;

amplitude control means including a first current mirror and a second current mirror operably connected to said energy storage means, said oscillating means and said variable capacitance means for initiating oscillation of said oscillating means and controlling said amplitude of said output signal; and wherein said amplitude control means provides automatic, closed-loop adjustment of said amplitude of said oscillating output signal.

20. The VCO of claim 19, wherein said inductance of said energy storage means, said capacitance of said energy storage means, and said variable capacitance of said variable capacitance means determine said frequency of said oscillating output signal.

21. A method of adjusting the frequency and amplitude of an oscillating output signal, comprising the steps of:

receiving an input signal having a varying level;

varying a capacitance of a varactor according to said varying level of said input signal;

adjusting the frequency of an oscillator according to said capacitance of said varactor to provide an oscillator output signal;

providing current conduction for amplitude control upon an energy storage circuit portion reaching or exceeding a peak level;

continuing to provide current conduction to stabilize said amplitude; and adjusting current to achieve a desired amplitude after said amplitude is stabilized.

22. The method of claim 21, wherein said varactor comprises at least one MOSFET.

23. The method of claim 21, further comprising the step of continuously adjusting the current in a closed-loop fashion to maintain said desired amplitude.

24. A voltage controlled oscillator (VCO) for use in communication systems, comprising:

an energy storage circuit portion having an inductance and a capacitance;

an oscillator providing an oscillating output signal having a frequency and an amplitude, wherein said oscillator is operably connected to said energy storage circuit portion;

a varactor having a capacitance, wherein said varactor is operably connected to said energy storage circuit portion and said oscillator, wherein said varactor receives an input signal having a varying level, and wherein said capacitance of said varactor varies according to said varying level of said input signal; and an amplitude controller including a first current mirror and a second current mirror operably connected to said energy storage circuit portion, said oscillator, and said varactor, wherein said amplitude controller initiates the oscillation of said oscillator and sets said amplitude of said oscillating output signal; and wherein said capacitor of said energy storage circuit portion, said oscillator, said varactor, and said amplitude controller are fabricated entirely on-chip with CMOS technology and wherein said inductor of said energy storage circuit portion is located off-chip.

25. The VCO of claim 24, wherein said inductance of said energy storage circuit portion, said capacitance of said energy storage circuit portion, and said capacitance of said varactor determine said frequency of said oscillating output signal.

26. The VCO of claim 24, wherein said varactor comprises at least one MOSFET.

27. The VCO of claim 24, wherein said voltage controlled oscillator is fabricated entirely with CMOS technology.

28. The VCO of claim 24, wherein said oscillator provides a balanced, differential, oscillating output signal.

29. The VCO of claim 24, wherein said amplitude controller provides automatic, closed-loop adjustment of said amplitude of said oscillating output signal.

30. A voltage controlled oscillator (VCO) for use in communication systems comprising:

energy storage means for providing an inductance and a capacitance;

oscillating means for providing an oscillating output signal having an amplitude and a frequency, wherein said oscillating means is operably connected to said energy storage means;

variable capacitance means for providing a variable capacitance, wherein said variable capacitance means is operably connected to said energy storage circuit portion means and said oscillating means, wherein said variable capacitance means receives an input signal having a varying level, and wherein said variable capacitance varies according to said varying level of said input signal;

amplitude control means including a first current mirror and a second current mirror operably connected to said energy storage means, said oscillating means and said variable capacitance means for initiating oscillation of said oscillating means and controlling said amplitude of said output signal; and wherein said capacitor of said energy storage means, said oscillating means, said variable capacitance means, and said amplitude control means are fabricated entirely on-chip with CMOS technology and wherein said inductor of said energy storage means is located off-chip.

31. The VCO of claim 30, wherein said inductance of said energy storage means, said capacitance of said energy storage means, and said variable capacitance of said variable capacitance means determine said frequency of said oscillating output signal.

32. The VCO of claim 30, wherein said variable capacitance means comprises at least one MOSFET.

33. The VCO of claim 30, wherein in said voltage controlled oscillator is fabricated entirely with CMOS technology.

34. The VCO of claim 30, wherein said oscillating means provides a balanced, differential, oscillating output signal.

35. The VCO of claim 30, wherein said amplitude control means provides automatic, closed-loop adjustment of said amplitude of said oscillating output signal.

* * * * *